United States Patent
Reeber et al.

(10) Patent No.: US 10,304,667 B1
(45) Date of Patent: May 28, 2019

(54) APPARATUS AND METHOD FOR CLEANING AN INLET OF A MASS SPECTROMETER

(71) Applicant: Thermo Finnigan LLC, San Jose, CA (US)

(72) Inventors: Steven L. Reeber, San Jose, CA (US); Cornelia L. Boeser, San Jose, CA (US)

(73) Assignee: THERMO FINNIGAN LLC, San Jose, CA (US)

( * ) Notice: Subject to any disclaimer, the term of this patent is extended or adjusted under 35 U.S.C. 154(b) by 0 days.

(21) Appl. No.: 15/842,729

(22) Filed: Dec. 14, 2017

(51) Int. Cl.
| | |
|---|---|
| *H01J 49/04* | (2006.01) |
| *H01J 37/32* | (2006.01) |
| *H01J 49/26* | (2006.01) |
| *H01J 49/10* | (2006.01) |

(52) U.S. Cl.
CPC ........ *H01J 37/32862* (2013.01); *H01J 49/04* (2013.01); *H01J 49/107* (2013.01); *H01J 49/26* (2013.01)

(58) Field of Classification Search
USPC ........................................................ 250/288
See application file for complete search history.

(56) References Cited

U.S. PATENT DOCUMENTS

| | | | | |
|---|---|---|---|---|
| 4,055,987 A | * | 11/1977 | McFadden .......... | H01J 49/0431 210/198.2 |
| 4,730,111 A | * | 3/1988 | Vestal ................ | G01N 30/7253 250/281 |
| 6,278,111 B1 | * | 8/2001 | Sheehan ............... | H01J 49/049 250/281 |
| 6,380,538 B1 | * | 4/2002 | Bajic ...................... | H01J 49/10 250/281 |
| 8,933,399 B2 | | 1/2015 | Sampei | |
| 2015/0075564 A1 | | 3/2015 | Schurenberg et al. | |

FOREIGN PATENT DOCUMENTS

| | | |
|---|---|---|
| GB | 2521027 B | 11/2017 |
| JP | 2005259477 A | 9/2005 |
| WO | WO1999008309 A1 | 2/1999 |
| WO | WO03060509 A1 | 7/2003 |
| WO | WO2015087645 A1 | 6/2015 |
| WO | WO2018055483 A1 | 3/2018 |

OTHER PUBLICATIONS

AB SCIEX, Instrument Front-End Cleaning Procedure, RUO-IDV-05-0385-B-D5026488 C, 34 pgs., 2013.
KNAUER PLATINblue MSQ Plus, Hardware Guide V6950A, 145 pgs., 2011.
MANURA , Scientific Instruments Services, MS TIP: Mass Spectrometer Source Cleaning Procedures, 15 pgs., 2002.
UniMS Mass Spectrometry Unit, 9 pgs., undated.

* cited by examiner

*Primary Examiner* — Phillip A Johnston
(74) *Attorney, Agent, or Firm* — A. J. Gokcek (57) ABSTRACT

A method of removing sample residue from a surface of a mass spectrometer inlet, with the surface being adjacent to an ion passageway, is provided. A pendent droplet of a cleaning solvent is formed at a tip of a capillary, with the tip being spaced apart from the surface. The pendent droplet detaches from the tip and contacts the surface. The surface is heated to a temperature T at least 50° C. above the boiling point of the least volatile component of the cleaning solvent.

20 Claims, 8 Drawing Sheets

APPARATUS AND METHOD FOR CLEANING AN INLET OF A MASS SPECTROMETER

FIELD OF THE INVENTION

This invention relates to a mass spectrometry apparatus and method. More specifically, this invention relates to a mass spectrometry apparatus and method of removing sample residue from a surface of a mass spectrometer inlet.

BACKGROUND OF THE INVENTION

The analysis of samples by mass spectrometry requires the analyte material to be ionized such that the mass-to-charge ratios (m/z's) of the resultant gas-phase ions can be determined. Ionization techniques have been developed over the years to charge sample atoms and molecules based on their inherent polarity, stability and size. Positively-charged ions (cations) or negatively-charged ions (anions) generated by ionization of the sample in an ion source are then transferred to downstream regions of a mass spectrometer via an inlet for subsequent processing (e.g., dissociation) and separation according to their m/z's. The inlet is provided with a passageway, such as the central bore of an ion transfer tube or a sampler cone orifice, permitting the transfer of ions and entraining gas therethrough. Typically, transfer of ions to the downstream regions through the inlet occurs under the influence of electrostatic field and/or pressure gradients.

During operation of the mass spectrometer, some fraction of the material emitted by the ion source impinges upon inlet surfaces adjacent to the passageway. Accumulation of this material on the inlet surfaces, which may be particularly prevalent when certain types of ionization sources are utilized and/or when "dirty" sample matrices (e.g., whole blood or urine) are analyzed, may eventually interfere with the passage of ions through the inlet, either by physically blocking a portion of the passageway or by altering electrical fields, leading to reduced sensitivity. Furthermore, material deposited on inlet surfaces during analysis of one sample may contaminate subsequently analyzed samples, producing sample crossover and yielding erroneous results.

In order to clean the residue from inlet surfaces and avoid the problems associated with excessive accumulation, it is typically necessary for the instrument operator to manually clean the affected surface, for example by applying a suitable solvent and wiping the surface with a cleaning cloth. This procedure requires that operation of the instrument be interrupted, and may also require the operator to disassemble some portion of the ion source to allow access to the inlet surface, both of which may be undesirable.

U.S. Pat. No. 6,380,538 discloses an ion source having a conduit that continuously dispenses cleaning fluid, such as water, onto a surface of an orifice member that forms the inlet into lower pressure regions of a mass spectrometer. The dispensed fluid then flows toward and over the orifice edge and into the lower pressure regions under the influence of the pressure gradient. The action of continuously dispensing cleaning fluid onto the orifice member surface is said to reduce or avoid the problem of orifice blocking arising from the deposition of involatile substances near the orifice. While this approach may be used with some success for certain instruments and applications, the continuous flow of cleaning fluid into the mass spectrometer may interfere with the measurement of analytes of interest. Furthermore, the action of the continuously flowing cleaning fluid may cause involatile substances to be passed to the lower pressure regions of the mass spectrometer, where they may contaminate surfaces of ion optics or mass analyzers and adversely impact instrument performance.

What is needed is a method and apparatus for cleaning the inlet of the mass spectrometer without interruption to instrument operation or removal of the ion source, and which prevents the introduction of undesirable materials into the mass spectrometer.

SUMMARY

Embodiments of the present invention disclose an apparatus and method of mass spectrometry. In one embodiment, a method of removing a sample residue from a surface of a mass spectrometer inlet is provided, with the surface being adjacent to an ion passageway. The method includes forming a pendent droplet of a cleaning solvent at a tip of a capillary, the tip being spaced apart from the surface. The method also includes causing the pending droplet to detach from the tip and to contact the surface. The method further includes heating the surface to a temperature T at least 50° C. above the boiling point of the least volatile (i.e., highest boiling point) compound of the cleaning solvent.

The step of causing the pendent droplet to detach from the tip may comprise inducing a gas flow around the capillary tip toward an inlet of the ion passageway.

The step of forming the pendent droplet may comprise delivering the cleaning solvent to the capillary by a pump. The pump may be operated continuously or at intermittent intervals.

In some embodiments, the surface of the mass spectrometer inlet is an end face of an ion transfer tube.

The sample droplet may comprise a mixture of water and an organic solvent. In some embodiments, the sample droplet comprises a mixture of about 50% water and about 50% methanol. The volume of the detached droplet may be between 1 and 20 microliters. In some embodiments, the volume of the detached droplet is at least 5 microliters.

The capillary tip may be spaced away from the surface of the mass spectrometer by a distance of less than two millimeters. In some embodiments, the capillary tip comprises a fused silica capillary. The capillary tip, however, is not limited to this embodiment and may comprise other materials with high heat capacities and high melting temperatures.

The method may further comprise a step of generating ions from a sample, and the sample comprising a biological fluid. The biological fluid may be, but is not limited to, whole blood. In some embodiments, the step of generating ions from a sample may comprise electrospraying ions from a porous medium.

In another embodiment of the present invention, a mass spectrometry apparatus is disclosed. The apparatus includes an ion source, located in an ionization region, for generating ions from a sample. The apparatus also includes an ion passageway for transferring the ions from the ionization region to a vacuum region. The vacuum region is maintained at a reduced pressure relative to the ionization region which induces a gas flow from the ionization region to the vacuum region. The apparatus also includes a surface adjacent to the ion passageway, and a capillary having a terminal tip spaced apart from the surface. The apparatus also includes a cleaning solvent supply for delivering a flow of cleaning solvent to the capillary, such that a pendent droplet is formed at the capillary tip, and a heater for maintaining the temperature T of the surface at least 50° C. above the boiling point of the least volatile component of the cleaning solvent. The gas flow causes the pendent droplet to become detached from the tip and to be directed toward the surface.

In some embodiments, the ion passageway is a central bore of an ion transfer tube, and the surface is an end face of the ion transfer tube.

The pump may be configured to deliver the cleaning solvent to the capillary only during periods when the ions are not being analyzed in a mass analyzer located downstream of the vacuum region.

Utilization of the cleaning method and apparatus implemented in accordance with certain embodiments of the present invention may provide significant benefits. Heating the surface to an elevated temperature results in rapid evaporation of the cleaning solvent droplet when it contacts the surface, producing an expansion of solvent vapor that may be particularly effective in dislodging the accumulated residue from the inlet surface. Furthermore, the propulsive force arising from the rapid solvent evaporation may cause the residue to be ejected in a direction away from the inlet passageway, thereby avoiding or reducing the transfer of the residue into downstream portions of the mass spectrometer.

DETAILED DESCRIPTION OF EMBODIMENTS

Figure 1:
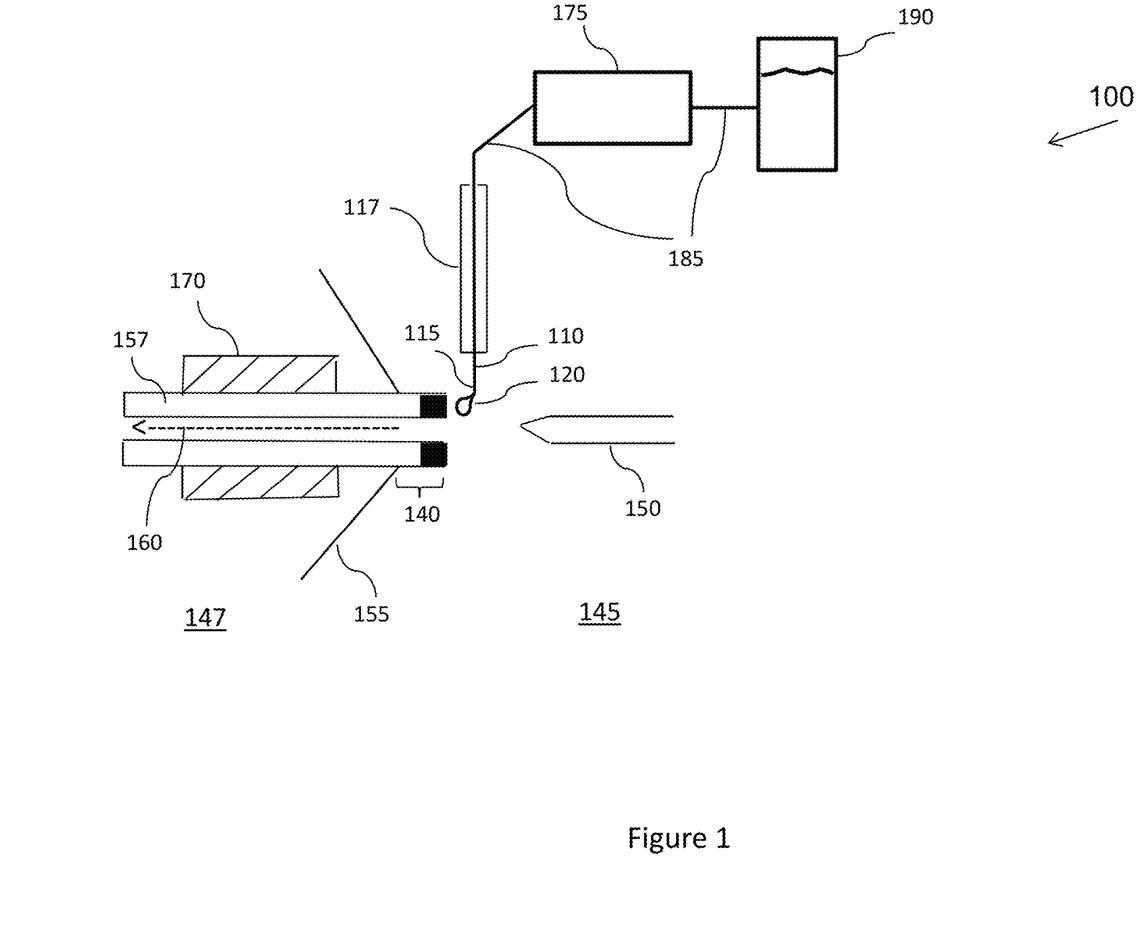
FIG. 1 is a schematic diagram of an apparatus for mass spectrometry, in according with one embodiment of the present invention.

FIG. 1 is a schematic diagram of an apparatus 100 for mass spectrometry, in according with one embodiment of the present invention. A capillary 110 having a terminal tip 115 is provided for forming a pendent droplet 120 of solvent solution, which will typically have a volume between 1 and 20 µl. The capillary tip may comprise a fused silica tip which has an inner diameter of about 1-15µ. It should be noted that other suitable materials having the capability of withstanding high temperatures without degrading may be substituted for fused silica. Optionally, the capillary 110 may be coupled to a holder 117 to hold the capillary 110. The solvent solution may be a blend of water and an organic solvent such as, but not limited to, methanol. In some embodiments, the solvent is a 50:50 methanol/water solution.

The apparatus 100 also includes an inlet 140 that forms a partition between an ionization region 145 and a lower pressure region 147 maintained at a reduced pressure relative to ionization region 145. An ion source 150 is located in an ionization region and is operative to generate ions from a sample to be analyzed. In certain implementations, the sample may take the form of a biological fluid, such as blood or urine, or a biological tissue extract. Ion source 150 may be a direct ionization source in which a sample spot is deposited on a porous medium, and a solvent is added to the sample spot to cause components of the sample (for example, therapeutic drugs present in a blood sample) to flow through the porous medium to a pointed tip, from which ions of the sample components are electrosprayed into ionization region 145. Ion sources of this description are marketed by Prosolia Inc. (Zionsville, Ind.) under the trademark PaperSpray®. In alternative embodiments, ion source 150 may take the form of a conventional electrospray source, or an atmospheric pressure chemical ionization (APCI) source.

Inlet 140 may include a sample cone structure 155 coupled to a small bore capillary referred to herein as an ion transfer tube 157 to limit gas conductance for good vacuum inside the mass spectrometer. The inner bore of ion transfer tube 157 defines an ion passageway 160 through which ions generated by ion source 150 flow under the influence of the pressure gradient and/or an electrostatic field gradient. Ion transfer tube 157 is positioned in thermal contact with a heater 170 (for example, a resistance-type cartridge heater) to heat the flow of ions and gas within ion passageway 170 and promote evaporation of residual solvent and dissociation of ion-solvent clusters. Heater 170 is coupled to a controller (not depicted) which regulates the voltage applied to the heater such that ion transfer tube 157 is maintained at a target temperature. Ion transfer tube 157 has an end face surface 158 (see FIGS. 2A-2C) that surrounds the entrance to ion passageway 160. Due to its proximity to the ion passageway entrance and to the ion source, material produced by ion source 150 may impinge upon and accumulate on end face surface 158, which (as discussed above) may eventually interfere with the entrance of ions into ion passageway 160.

Still referring to FIG. 1, the apparatus 100 further includes a pump 175 and a solvent solution reservoir 190, fluidically coupled to the capillary 110 via feedlines 185. Pump 175, which may operate continuously or at intermittent intervals, is connected with a reservoir 190 of solvent solution for forcing the solvent solution into and through the capillary 110.

Figure 2A:
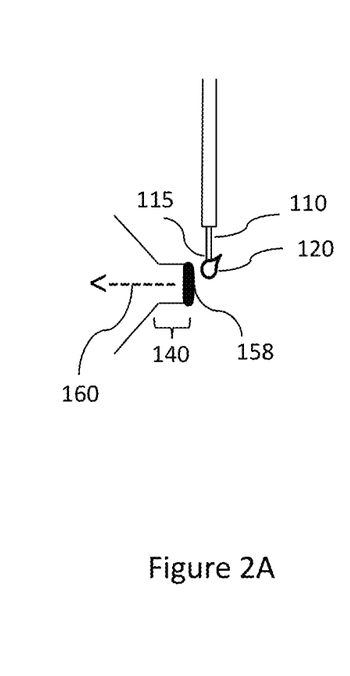
FIGS. 2A-2C symbolically illustrate the stages of pendent droplet formation, droplet detachment, and impingement of the free droplet on a surface of a mass spectrometer inlet, in accordance with one embodiment of the present invention.
Figure 2B:
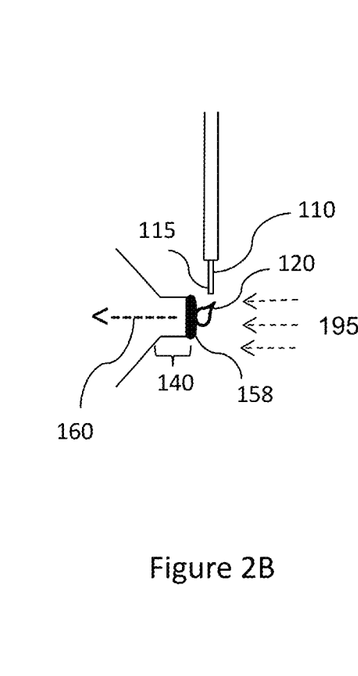
Figure 2C:
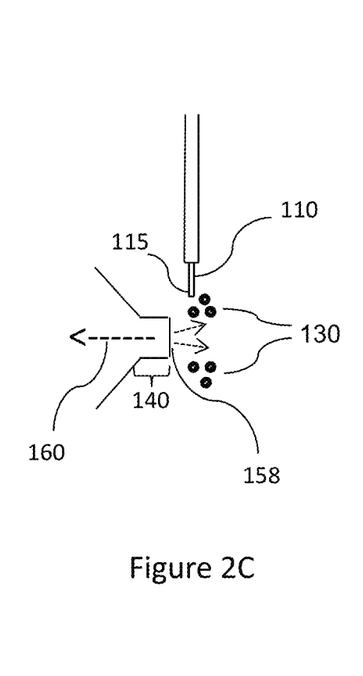

FIGS. 2A-2C symbolically illustrate the stages of pendent droplet formation, droplet detachment, and impingement of the free droplet on a surface of a mass spectrometer inlet, in accordance with one embodiment of the present invention. FIG. 2A shows a pendent droplet 120 of a cleaning solvent formed at the tip 115 of capillary 110. As depicted, pendent droplet 120 has a bulbous portion situated outside the capillary that remains in contact (via surface tension) with the column of liquid within the capillary interior volume. The pressure-gradient induced gas flow 195 from ionization region toward passageway exerts a shear force on pendent droplet 120, overcoming the surface tension holding it in place and causing the droplet to detach from the capillary tip. The shear force exerted by the gas flow 195 on the free droplet moves the droplet in the direction of the inlet (more specifically, toward ion transfer tube end face 158, as depicted in FIG. 2B. When the free droplet contacts end face 158, which is heated via heater 170 to a temperature at least 50° C. above the boiling point of the least volatile (i.e., highest boiling point) component of the solvent solution, the solvent is rapidly vaporized. This rapid vaporization and expansion of the resultant gas causes residue 130 accumulated on end face 158 to become dislodged, and to be ejected in a direction opposite to the gas/ion flow (see FIG. 2C), which beneficially avoids or reduces the entrance of the residue into ion passageway 160 and subsequently into downstream regions of the mass spectrometer. In order to provide effective cleaning of the inlet, the distance at which capillary tip 115 is positioned relative to the inlet, as well as the volume of the pendent droplet generated at capillary tip 115 (which is governed by the inner diameter of capillary 110, the surface tension of the solvent, and the rate at which the solvent is pumped) are preferably set such that the droplet impacts all or a substantial portion of the inlet surface on which residue is accumulated. In one example, the capillary tip is positioned at a distance of about 1 mm from the inlet, and the pendent droplet has a volume of about 10 µL.

Figure 3:
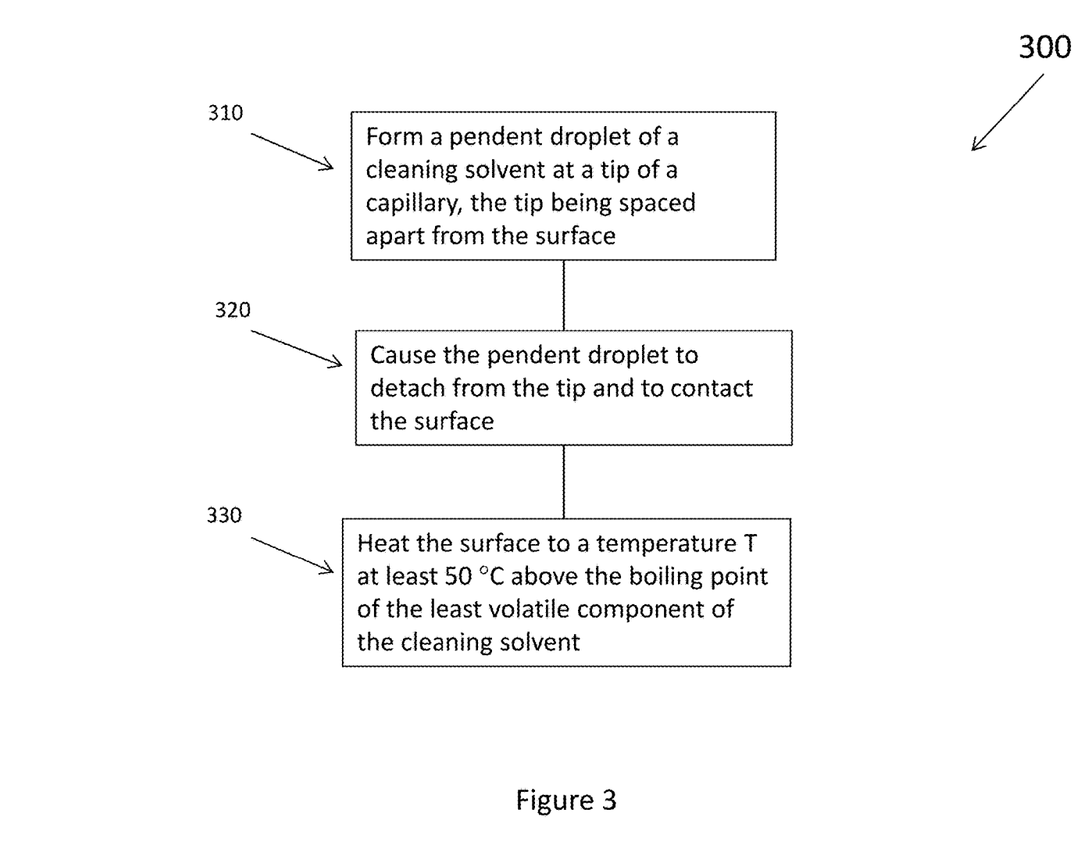
FIG. 3 is a flowchart depicting steps of a method of mass spectrometry, in accordance with one embodiment of the present invention.

FIG. 3 is a flowchart depicting steps of a method of removing sample residue from a surface of a mass spectrometer inlet, the surface being adjacent to an ion passageway, in accordance with one embodiment of the present invention. In step 310, a pendent droplet of a cleaning solvent is formed at the tip of a capillary, with the tip being spaced apart from the surface. The pendent droplet may be formed by delivering the cleaning solvent to the capillary by a pump. In step 320, the pendent droplet is made to detach from the tip and to contact the surface. In this step, a gas flow is induced around the capillary tip toward an inlet of the ion passageway. In step 330, the surface of the mass spectrometer inlet is heated to a temperature at least 50° C. above the boiling point of the least volatile component of the cleaning solvent. For example, if the cleaning solvent comprises water (boiling point 100° C.) and methanol (boiling point 64.7° C.), the temperature of the inlet is set to at least 50° C. above the boiling point of water—to at least 150° C. Those of skill in the art will be able to set the appropriate temperature of the mass spectrometer inlet for other cleaning solvent solutions. It will also be understood by those of ordinary skill in the art that the order of steps shown in the method 300 of FIG. 3 are not meant to limit the scope of embodiments of the present invention in any way and, in fact, the steps may occur in a variety of different sequences within embodiments hereof. For instance, the temperature of the mass spectrometer inlet may be heated to at least 50° C. above the boiling point of the least volatile solvent before the droplet comes in contact with the surface.

The following examples demonstrate the ability to remove sample residue from the surface of a mass spectrometer inlet according to embodiments of the present invention. However, the scope of the present invention should not be limited to the examples provided herein.

Example 1

Figure 4A:
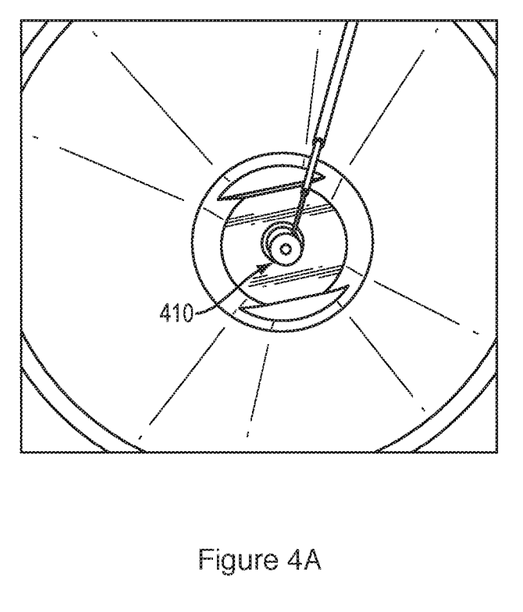
FIG. 4A shows the inlet of a mass spectrometer after twenty ionization cycles with the cleaning device off during operation of the mass spectrometer.
Figure 4B:
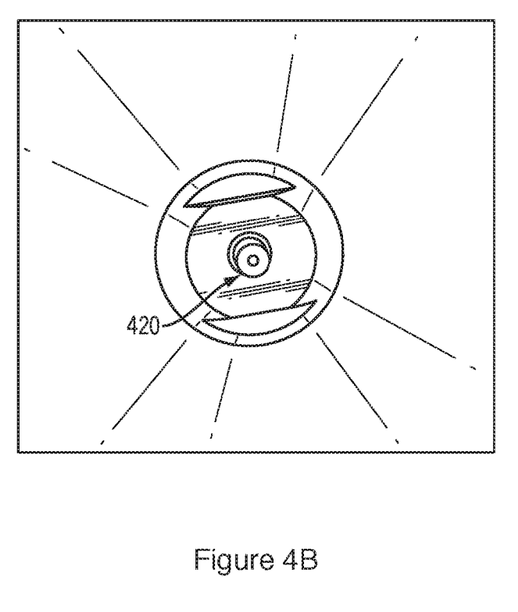
FIG. 4B shows the inlet of a mass spectrometer of FIG. 5A after twenty ionization cycles with the cleaning device on during operation of the mass spectrometer.

Whole blood samples were deposited onto paper substrates in disposable cartridges for paper spray ionization cycles. The ion source was placed approximately six millimeters from the inlet surface of a mass spectrometer. The tip of a capillary, described above in FIGS. 1 and 2, was positioned a distance of approximately 1 mm from the inlet surface of the mass spectrometer. A solvent solution supply containing a 50:50 mixture of water and methanol and a pump were coupled to the capillary via a feedline. The pump was switched on between cycles to deliver one or more droplets of the solvent solution to the capillary tip in the following order: Specifically, the sequence of operation of the pump was as follows: 1. Run sample, 2 Remove sample, 3. Switch on pump, 4. Switch off pump, and repeat steps 1-4. The mass spectrometer inlet was heated to and maintained at a temperature of 200° C. FIG. 4A shows inlet 410 of a mass spectrometer after twenty ionization cycles with the pump turned off during operation of the mass spectrometer. Discoloration due to buildup of residue is formed on the inlet surface while the pump is turned off. FIG. 4B shows the inlet 420 of the mass spectrometer of FIG. 4A after twenty ionization cycles with the pump switched on between cycles. No buildup of residue is formed when the pump is switched on between the twenty cycles.

Example 2

Figure 5A:
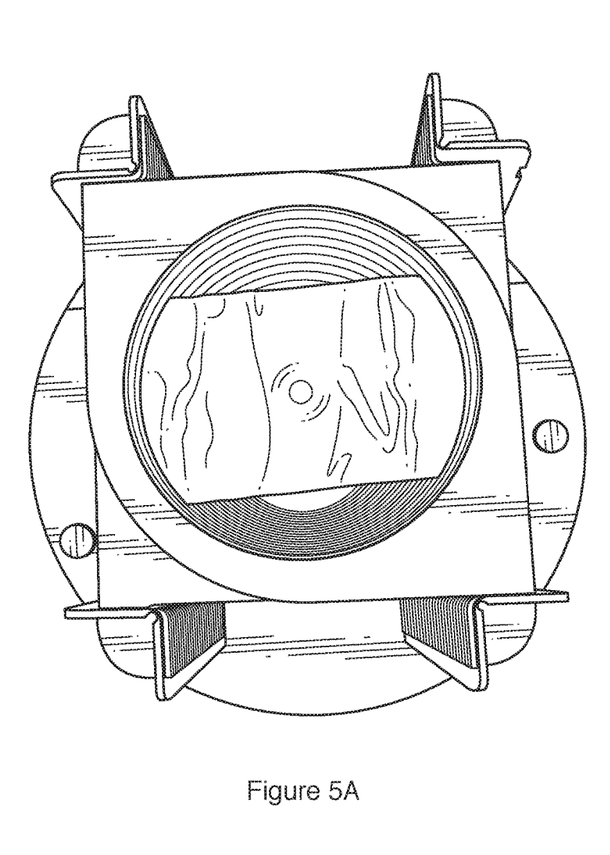
FIG. 5A shows the interior of the inlet of a mass spectrometer, with copper tape added to collect any materials that might enter the inlet, after twenty ionization cycles with the cleaning device off during operation of the mass spectrometer.

Example 2 used a set up similar to that in Example 1, with 5-10 µL whole blood samples deposited on a paper substrate for paper spray ionization, except a strip of copper tape was adhered to inside the interior end of an ion transfer tube (mass spectrometer inlet). FIG. 5A shows the interior of the ion transfer tube, with copper tape, after twenty ionization cycles with the pump turned off during operation of the mass spectrometer.

Figure 5B:
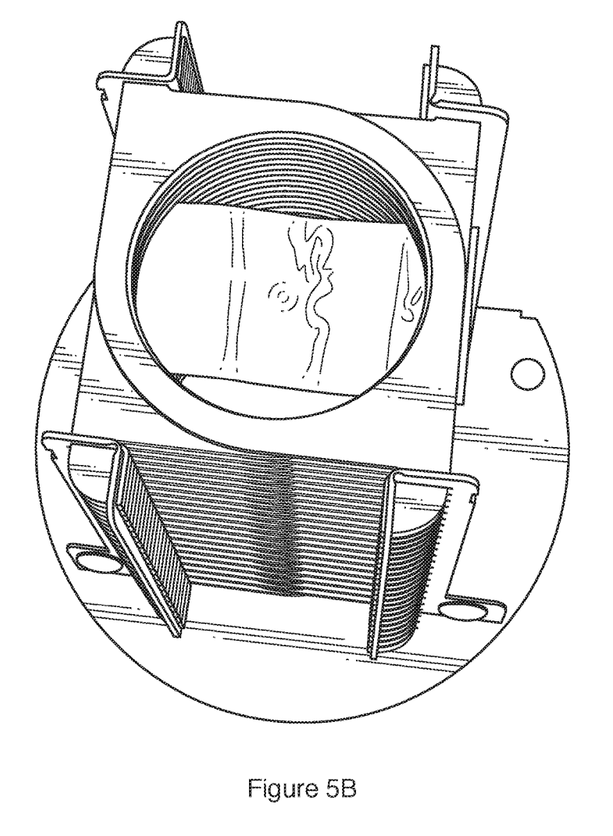
FIG. 5B shows the interior of the inlet of a mass spectrometer, with copper tape added to collect any materials that might enter the inlet, after twenty ionization cycles with the cleaning device turned on during operation of the mass spectrometer.

FIG. 5B shows the interior of the inlet of the ion transfer tube, with copper tape, after twenty ionization cycles with the pump switched on between cycles. No increase in the quantity of sample residue was transported into the ion transfer tube when the pump was turned on for twenty cycles.

Example 3

Figure 6A:
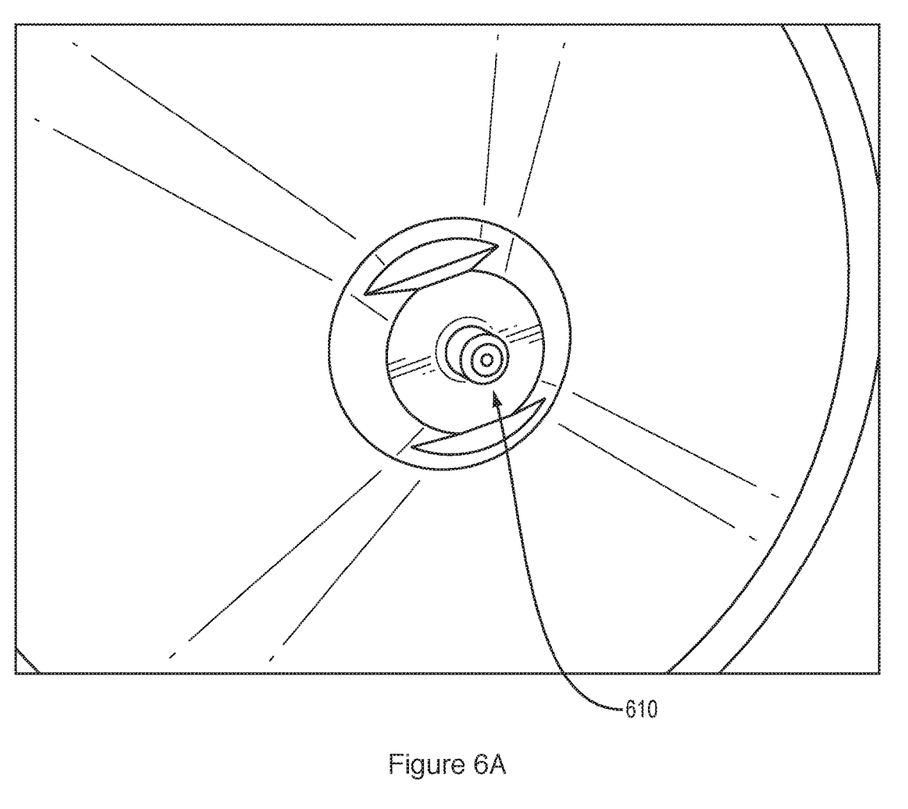
FIG. 6A shows the inlet of a mass spectrometer with blue ink spotted on the surface of the inlet before operation of the mass spectrometer.
Figure 6B:
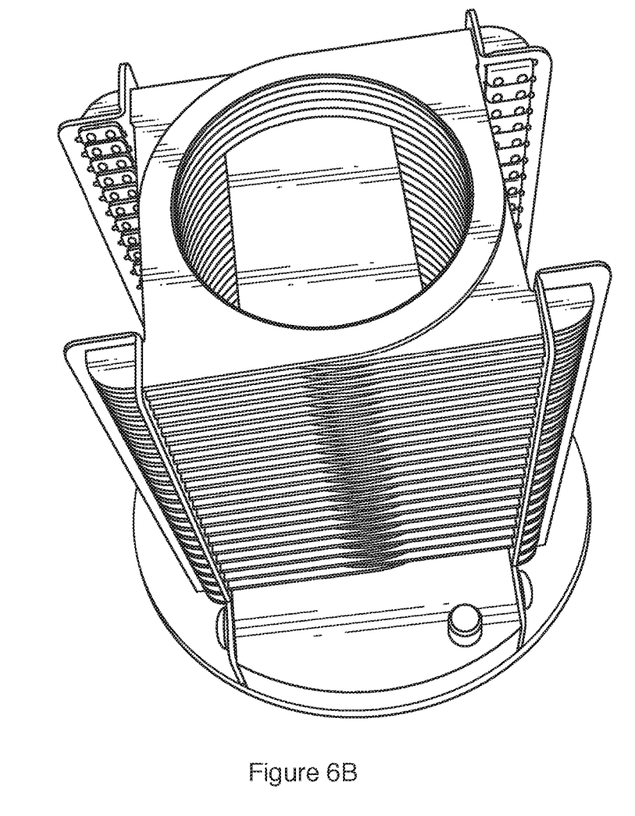
FIG. 6B shows the interior of the inlet of the mass spectrometer of FIG. 6A after three ionization cycles with the cleaning device turned on during operation of the mass spectrometer.

Example 3 used a set up similar to that in Example 2, including copper tape adhered to inside the interior end of the ion transfer tube, except blue ink was also spotted on the end face of the ion transfer tube. Also, the experiments in Example 3 were performed with no ion source mounted but the mass spectrometer was maintained under vacuum. FIG. 6A shows the end face 610 of the ion transfer tube before operation of the mass spectrometer. FIG. 6B shows the interior of the ion transfer tube of FIG. 6A, with copper tape, after three experiments with the pump switched on between runs. In the experiment of FIG. 6B, the ink was applied and then washed off using the embodiment of the present invention described in in the Examples, then reapplied and washed off again a second time (using the embodiment of the present invention described in the Examples), and then reapplied for the third time and then washed off again (using the embodiment of the present invention described in the Examples). No ink was observed to transfer to the interior of the ion transfer tube with the pump turned on during the runs. Some solvent of the solvent solution entered the interior of the ion transfer tube. However, the blue ink was ejected away from the end face 610 of the ion transfer tube by the expanding steam caused by the solvent contacting the heated surface of the ion transfer tube with the pump turned on. Moreover, the rapid boiling of the solvent solution on the heated surface minimized the amount of solvent introduced into the ion transfer tube.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A method of removing sample residue from a surface of a mass spectrometer inlet, the surface being adjacent to an ion passageway, the method comprising:
   a. forming a pendent droplet of a cleaning solvent at a tip of a capillary, the tip being spaced apart from the surface;
   b. causing the pendent droplet to detach from the tip and to contact the surface; and
   c. heating the surface to a temperature T at least 50° C. above the boiling point of the least volatile component of the cleaning solvent.

2. The method of claim 1, wherein the step of causing the pendent droplet to detach from the tip comprises inducing a gas flow around the capillary tip toward an inlet of the ion passageway.

3. The method of claim 1, wherein the step of forming the pendent droplet comprises delivering the cleaning solvent to the capillary by a pump.

4. The method of claim 3, wherein the pump is operated continuously.

5. The method of claim 3, wherein the pump is operated at intermittent intervals.

6. The method of claim 1, wherein the surface is an end face of an ion transfer tube.

7. The method of claim 1, wherein the cleaning solvent is a mixture of water and an organic solvent.

8. The method of claim 7, wherein the cleaning solvent is a 50:50 mixture of water and methanol.

9. The method of claim 1, wherein the capillary tip is spaced from the surface a distance of less than two millimeters.

10. The method of claim 1, wherein a volume of the detached droplet is between 1 and 20 µL.

11. The method of claim 10, wherein the volume is at least 5 µL.

12. The method of claim 1, further comprising a step of generating ions from a sample, the sample comprising a biological fluid.

13. The method of claim 12, wherein the biological fluid is whole blood.

14. The method of claim 12, wherein the step of generating ions from a sample comprises electrospraying ions from a porous medium.

15. A mass spectrometry apparatus, comprising:
   a. an ion source, located in an ionization region, for generating ions from a sample;
   b. an ion passageway for transferring the ions from the ionization region to a vacuum region, the vacuum region being maintained at a reduced pressure relative to the ionization region which induces a gas flow from the ionization region to the vacuum region;
   c. a surface adjacent the ion passageway;
   d. a capillary having a terminal tip spaced apart from the surface;
   e. a cleaning solvent supply for delivering a flow of cleaning solvent to the capillary, such that a pendent droplet is formed at the capillary tip; and
   f. a heater for maintaining a temperature T of the surface at least 50° C. above the boiling of the least volatile component of the cleaning solvent;
   wherein the gas flow causes the pendent droplet to become detached from the tip and to be directed toward the surface.

16. The apparatus of claim 15, wherein the ion passageway is a central bore of an ion transfer tube, and the surface is an end face of the ion transfer tube.

17. The apparatus of claim 15, wherein the capillary tip is spaced from the surface a distance of less than two millimeters.

18. The apparatus of claim 15, wherein the ion source is configured to electrospray ions from a porous medium.

19. The apparatus of claim 15, wherein the cleaning solvent supply comprises a cleaning solvent reservoir and a pump.

20. The apparatus of claim 19 wherein the pump is configured to deliver the cleaning solvent to the capillary only during periods when the ions are not being analyzed in a mass analyzer located downstream of the vacuum region.

* * * * *